US008415965B2

(12) United States Patent
Cho et al.

(10) Patent No.: US 8,415,965 B2
(45) Date of Patent: Apr. 9, 2013

(54) METHOD OF TESTING A DISPLAY PANEL AND APPARATUS FOR PERFORMING THE METHOD

(75) Inventors: Da-Hye Cho, Goyang-si (KR); Ji-Young Jeong, Cheonan-si (KR); Jae-Ho Lee, Cheonan-si (KR); Seung-Jin Kim, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 818 days.

(21) Appl. No.: 12/496,386

(22) Filed: Jul. 23, 2009

(65) Prior Publication Data

US 2010/0219853 A1 Sep. 2, 2010

(51) Int. Cl.
*G01R 31/00* (2006.01)

(52) U.S. Cl. .................................................. 324/760.01

(58) Field of Classification Search .. 324/762.01–762.1, 324/760.01–760.02; 257/48; 438/14–18; 349/151–152, 12, 187, 40, 43
See application file for complete search history.

(56) References Cited

U.S. PATENT DOCUMENTS 5,363,037 A * 11/1994 Henley et al. .............. 324/750.3
5,504,438 A * 4/1996 Henley ...................... 324/760.02
7,133,039 B2 * 11/2006 Moon et al. ................... 345/211

FOREIGN PATENT DOCUMENTS

KR 1020060036655 5/2006
KR 1020070040505 4/2007
KR 1020070063310 6/2007
KR 1020080001063 1/2008

OTHER PUBLICATIONS

English Abstract for Publication No. 1020060036655.
English Abstract for Publication No. 1020070040505.
English Abstract for Publication No. 1020070063310.
English Abstract for Publication No. 1020080001063.

* cited by examiner

*Primary Examiner* — Tung X Nguyen
(74) *Attorney, Agent, or Firm* — F. Chau & Associates, LLC

(57) ABSTRACT

In a test method of a display panel, a test signal and a test voltage are generated according to a test control signal. A display area of the display panel is tested based on the test signal and the test voltage. A driving voltage line and an on/off voltage line formed on the display panel are tested based on the test signal and the test voltage.

12 Claims, 7 Drawing Sheets

METHOD OF TESTING A DISPLAY PANEL AND APPARATUS FOR PERFORMING THE METHOD

CROSS-REFERENCE TO RELATED APPLICATION

This application claims priority under 35 U.S.C. §119 to Korean Patent Application No. 10-2009-0008259, filed on Feb. 3, 2009 in the Korean Intellectual Property Office (KIPO), the contents of which are herein incorporated by reference in their entirety.

BACKGROUND OF THE INVENTION

1. Technical Field

Exemplar embodiments of the present invention relate to a display panel, and more particularly, to a method of testing a display panel and an apparatus for performing the method.

2. Discussion of the Related Art

Generally, a liquid crystal display (LCD) device includes a display panel that displays an image by transmitting light through a liquid crystal (LC) material and through a transparent substrate. The display panel includes an LC cell, a backlight unit (BLU), and circuitry for driving the LC cell and the BLU. The circuitry includes a gate driving circuit, a data driving circuit, a timing control circuit, and other related components. The LC cell mar include an array substrate and an opposite substrate facing the array substrate. The LC cell also includes an LC layer between the array substrate and the opposing substrate. The array substrate includes a thin-film transistor (TFT) array. The array substrate also includes a plurality of data lines, a plurality of gate lines, and a plurality of pixel electrodes. The LC cell includes an active area and a peripheral area. An image is displayed in the active area, and the peripheral area surrounds the active area. The peripheral area may include the gate driving circuit and the data driving circuit.

Some manufacturers of LCDs have adopted a chip-on-glass (COG) manufacturing method. In the COG method, an integrated circuit (IC) chip is mounted on a substrate of the LC cell. A gate driving IC, a data driving IC, and/or a timing control IC may be mounted on the substrate. The substrate may include glass or plastic and may be transparent.

In this case, defects of the active area of the display panel are detected through a cell test.

However, defects of power lines of the display panel are detected after the LCD is full assembled, and not at a cell test stage. Thus, manufacturing costs may be increased.

SUMMARY OF THE INVENTION

Exemplary embodiments of the present invention provide methods of testing a display panel capable of reducing manufacturing costs thereof by detecting defects of a display panel in an initial stage of a manufacturing process rather than after the LCD has been fully assembled.

Exemplary embodiments of the present invention also provide apparatuses for performing the above-mentioned method.

According to one aspect of the present invention, there is provided a method of testing a display panel. In the method, a test signal and a test voltage are generated according to a test control signal. A display area of the display panel is tested based on the test signal and the test voltage. A driving voltage line and an on/off voltage line formed on the display panel are tested based on the test signal and the test voltage.

According to an exemplary embodiment of the present invention, the display area may be tested by contacting a probe with a gate test pad and a data test pad respectively connected to ends of a gate line and a data line, and providing the gate test pad and the data test pad with the test signal and the test voltage through the probe. The driving voltage line and the on/off voltage line may be tested by contacting the probe with a driving voltage bump formed at an end of the driving voltage line and an on/off voltage bump formed at an end of the on/off voltage line, and providing the driving voltage bump and the on/off voltage bump with the test signal and the test voltage through the probe.

According to an exemplary embodiment of the present invention, the display area may be tested by contacting a pad testing probe with a gate test pad and a data test pad respectively connected to ends of a gate line and a data line formed on the display panel, and providing the gate test pad and the data test pad with the test signal and the test voltage through the pad testing probe. The driving voltage line and the on/off voltage line may be tested by contacting a line testing probe with a driving voltage bump formed at an end of the driving voltage line and an on/off voltage bump formed at an end of the on/off voltage line, and providing the driving voltage bump and the on/off voltage bump with the test signal and the test voltage through the line testing probe.

According to an exemplary embodiment of the present invention, testing the driving voltage line and the on/off voltage line may include testing a control signal line. A vertical start signal, a gate selection signal and an output enable signal may be transmitted through the control signal line. The vertical start signal selects a first gate line of the display panel. The gate selection signal sets a gate signal provided to the gate line at a high level based on a gate-on voltage. The output enable signal sets the gate signal at a low level based on the gate-off voltage.

According to an exemplary embodiment of the present invention, the display area, the driving voltage and the on/off voltage lines may be tested at substantially the same time and/or in one step.

According to an aspect of the present invention, an apparatus for testing a display panel includes a probe and a test controller. The probe makes contact with a gate line, a data line, a driving voltage line and an on/off voltage line of the display panel. The test controller generates a test signal and a test voltage to provide the probe with the test signal and the test voltage according to a test control signal provided from an external device. The test controller checks the test signal and the test voltage provided through the probe to test whether a display area, the driving voltage line, the on/off voltage line of the display panel are shorted or not.

According to an exemplary embodiment of the present invention, the probe may provide the test signal and the test voltage to a gate test pad and a data test pad respectively connected to an end of the gate line and an end of the data line. The probe may include a pad testing probe making contact with the gate test pad and the data test pad.

According to an exemplar, embodiment of the present invention, the probe may provide the test signal and the test voltage to a driving voltage bump formed at an end of the driving voltage line and an on/off voltage bump formed at an end of the on/off voltage line. The probe may include a line testing probe making contact with the driving voltage bump and the on/off voltage bump.

According to an exemplary embodiment of the present invention, the display panel may further include a control signal line. The probe may be electrically connected to the control signal line.

According to an exemplary embodiment of the present invention, a source voltage corresponding to a gray scale may be transmitted through the driving voltage line. A source voltage corresponding to a common voltage may be transmitted through the driving voltage line.

According to an exemplary embodiment of the present invention, defects of a driving voltage line and an on/off voltage line of a display panel may be detected when defects of a display area of the display panel are detected. Therefore, manufacturing costs of the display panel may be decreased.

BRIEF DESCRIPTION OF THE DRAWINGS

The above and other features and aspects of exemplary embodiments of the present invention may be described in detailed below with reference to the accompanying drawings, in which.

DETAILED DESCRIPTION OF THE EXEMPLARY EMBODIMENTS

Figure 1:
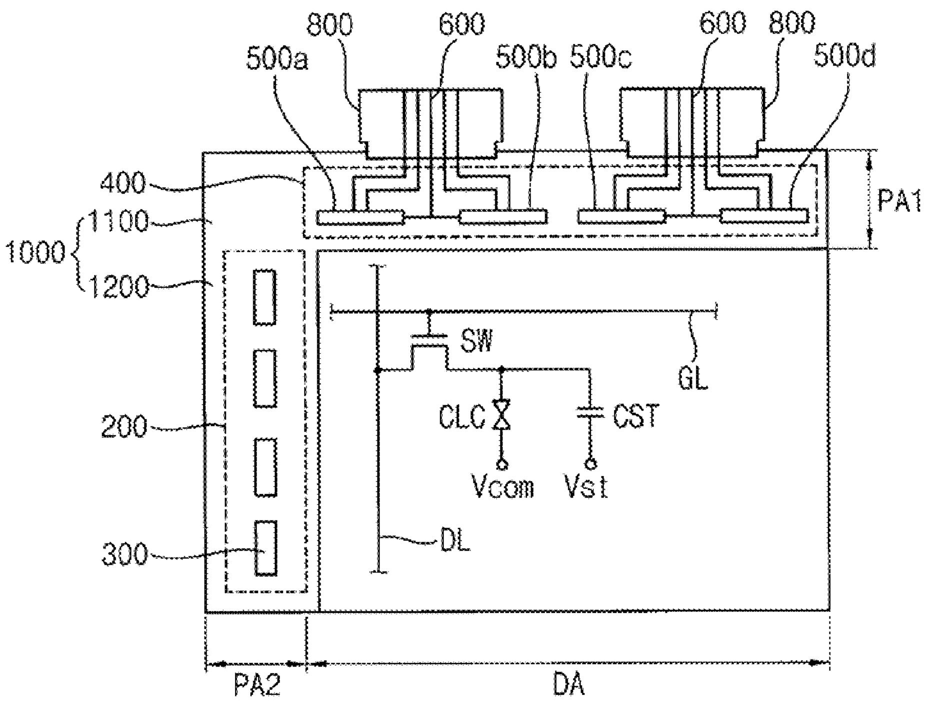
FIG. 1 is a plan view illustrating a display apparatus according to an exemplary embodiment of the present invention.

Exemplary embodiments of the present invention are described more fully hereinafter with reference to the accompanying drawings. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on." "connected to" or "coupled to" another element or layer, it can be directly on, connected or coupled to the other element or layer or intervening elements or layers may be present. Like numerals may refer to like elements throughout.

Hereinafter, exemplary embodiments of the present invention will be explained in detail with reference to the accompanying drawings.

FIG. 1 is a plan view illustrating a display apparatus according to an exemplary embodiment of the present invention.

Referring to FIG. 1, the display apparatus, according to the present exemplary embodiment, includes a display panel 1000, a gate line driver 200 and a data line driver 400 for driving the display panel 1000.

The display panel 1000 includes an array substrate 1100, an opposite substrate 1200 (for example, a color filter substrate) separated from the array substrate by a predetermined distance and facing the array substrate 1100, and a liquid crystal (LC) layer (not shown) disposed between the array substrate 1100 and the opposite substrate 1200. The display panel 1000 includes a display area DA, a first peripheral area PA1 and a second peripheral area PA2. The first and second peripheral areas PA1 and PA2 surround the display area DA.

The display area DA includes gate lines GL and data lines DL. A plurality of pixel portions is defined by the gate lines GL and the data lines DL so that an image is displayed on the display area DA. A switching element SW including a thin-film transistor (TFT), and an LC capacitor CLC and a storage capacitor CST which are electrically connected to the switching element are formed on each of the pixel portions.

For example, a gate electrode of the switching element SW is electrically connected to the gate line GL. A source electrode of switching element SW is electrically connected to the date line DL. A drain electrode of switching element SW is electrically connected to the LC capacitor CLC and the storage capacitor CST.

The first peripheral area PA1 may be disposed at an end of the data lines DL, and the second peripheral area PA2 may be disposed at an end of the gate lines GL.

The gate line driver 200 includes a shift register having a plurality of stages that are cascade-connected to each other. The gate line driver 200 sequentially outputs gate signals to the gate lines GL. The gate line driver 200 includes at least one gate line driving chip 300. The gate line driver 200 is formed in the second peripheral area PA2. The gate line driver 200 may be formed in the second peripheral area PA2 of the display panel 1000 as an integrated circuit (IC). Accordingly, an additional receiving space may not be necessary, and thus a relatively slim display apparatus may be manufactured.

In addition, the gate line driving chip 300 may be mounted on a tape carrier package (TCP) disposed between a printed circuit board (PCB, not shown) and the display panel 1000.

The data line driver 400 outputs an analog data signal to the data line DL synchronized with the gate signal. The data line driver 400 may include at least one data line driving chip.

The data line driving chip includes a first data line driving chip 500*a*, a second data line driving chip 500*b*, a third data line driving chip 500*c* and a fourth data line driving chip 500*d*. The data line driving chip is directly attached to the first peripheral area PA1 through a chip-on-glass (COG) method. The data line driving chips may receive a power line 600 through a flexible film 800. In this case, the data line driving chips are cascade-connected to each other so that the data line driving chips share the power line 600. There may also be fewer or more data line driving chips, as needed, and the invention should not be understood to be limited to having exactly four data line driving chips.

For example, the first data line driving chip 500*a* and the second data line driving chip 500*b* may share the power line 600 extended from the flexible film 800. In addition, the third data line driving chip 500*c* and the fourth data line driving chip 500*d* may share the power line 600 extended from the flexible film 800.

The power line 600 may extend to the gate line driving chip 300. Although not shown in the figure, the power line 600 extended from the first data line driving chip 500*a* may be formed on the display panel 1000 to be electrically connected to the gate line driving chip 300.

A conventional displays apparatus using the COG method includes a display, panel and a driving printed circuit formed on a chip electrically connected to each other through an anisotropic conductive film (ACF) without the TCP.

The driving printed circuit is electrically connected to each of the data line driving chips, and thus the conventional display apparatus includes the ACFs having substantially the same number of the data line driving chips.

However, referring to FIG. 1, in the displays apparatus according to an exemplary embodiment, the data line driving chips share a line such as the power line 600 through a cascade method, and thus a total number of the ACFs may be decreased.

Figure 2:
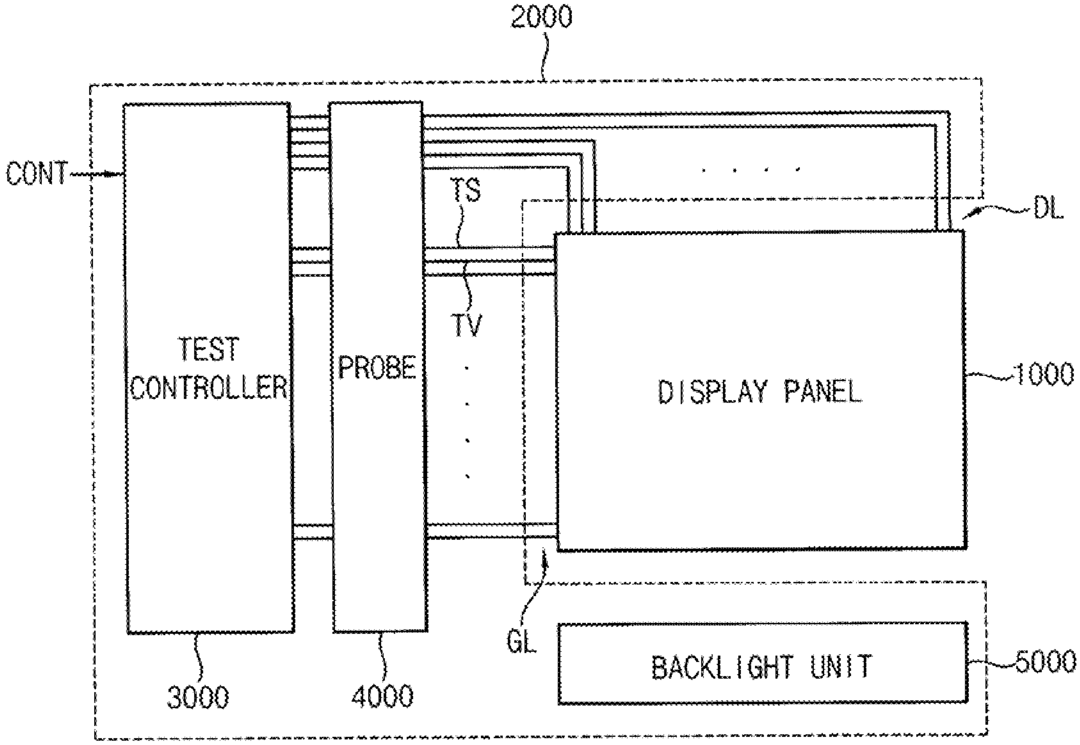
FIG. 2 is a plan view illustrating an apparatus for testing the display panel in FIG. 1.

FIG. 2 is a plan view illustrating an apparatus for testing the display panel in FIG. 1.

Referring to FIGS. 1 and 2, the apparatus 2000 of testing a display panel (hereinafter, referred to as the test apparatus 2000) includes a test controller 3000, a probe 4000 and a backlight unit 5000.

The display panel 1000 receives a test signal TS and a test voltage TV provided from the test controller 3000 through the probe 4000. The test controller 3000 checks the test signal TS and the test voltage TV provided through the probe 4000, to test whether the display area DA and the power line 600 are shorted or not.

In this case, voltage levels of the test signal TS and the test voltage TV may be adjusted according to an external test control signal CONT.

The backlight unit 5000 is disposed on the rear surface of the display panel 1000 to provide the display panel 1000 with light.

The display panel 1000 displaces an image based on the test signal TS and the test voltage TV.

Defects of the gate lines GL, defects of the data lines DL and defects of pixels (not shown) may be detected prior to final assembly of the LCD panel.

For example, a defect point in the display panel 1000 may be detected based on the test signal TS and the test voltage TV having the voltage levels adjusted for each of the gate lines GL and each of the data lines DL.

Figure 3:
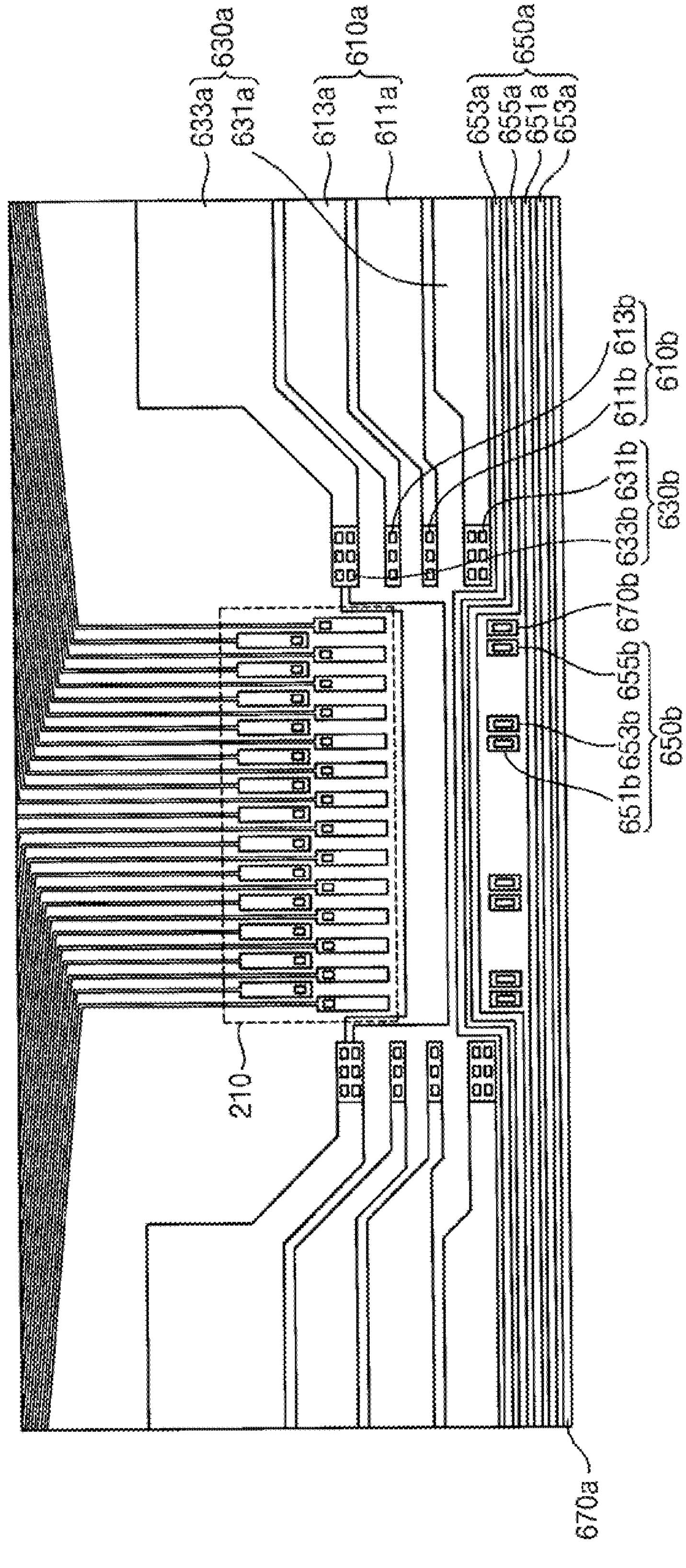
FIG. 3 is a plan view illustrating lines of the gate line driver in FIG. 1.

FIG. 3 is a plan view illustrating lines of the gate line driver in FIG. 1.

Referring to FIGS. 1 to 3, the gate line driver 200 includes a gate test pad 210. In addition, the power line in the gate line driver 200 includes a driving voltage line 610*a* and an on/off voltage line 630*a*.

The defects of the display area DA of the display panel 1000 may be detected through the gate test pad 210. The display panel 1000 operates when the gate line GL receives the test voltage TV through the gate test pad 210. In this case, the display panel 1000 may be defective when the display, area DA of the display panel 1000 does not operate uniformly. The gate test pad 210 may receive the test voltage TV from the probe 4000 which is an external test apparatus.

The driving voltage line 611*a* includes a first power line 611*a* and a second power line 613*a*.

The first power line 611*a* and the second power line 613*a* respectively receive a first power voltage VDD and a second power voltage VSS. The first power voltage VDD and the second power voltage VSS represent analog voltage sources including a gray scale voltage and a common voltage provided to the pixels of the display panel 1000.

A driving voltage bump 610*b* includes a first power bump 611*b* and a second power bump 613*b*. The first power bump 611*b* and the second power bump 613*b* are respectively formed at an end of the first power line 611*a* and an end of the second power line 613*a*. The gate line driving chip 300 is attached to upper portions of the first power bump 611*b* and the second power bump 613*b*. The first power bump 611*b* and the second power bump 613*b* respectively receive the eternally provided first power voltage VDD and the second power voltage VSS, and the first power voltage VDD and the second power voltage VSS are applied to the gate line driving chip 300.

The on/off voltage line 630*a* includes an on-voltage line 631*a* and an off-voltage line 633*a*.

The on-voltage line 631*a* and the off-voltage line 633*a* respectively receive a gate-on voltage VON and a gate-off voltage VOFF. The gate-on voltage VON and the gate-off voltage VOFF represent digital voltage sources provided to logic circuits.

An on/off voltage bump 630*b* includes an on-voltage bump 631*b* and an off-voltage bump 633*b*. The on-voltage bump 631*b* and the off-voltage bump 633*b* are respectively formed at an end of the on-voltage line 631*a* and an end of the off-voltage line 633*a*. The gate line driving chip 300 is attached to upper portions of the on-voltage bump 631*b* and the off-voltage bump 633*b*. The on-voltage bump 631*b* and the off-voltage bump 633*b* respectively receive the externally provided gate-on voltage VON and the gate-off voltage VOFF, and the gate-on voltage VON and the gate-off voltage VOFF are applied to the gate line driving chip 300.

Gate signals turning on or turning off the gate lines GL of the display panel 1000 are generated based on the gate-on voltage VON and the gate-off voltage VOFF.

Therefore, the display panel 1000 may display an image based on the first and second power voltages VDD and VSS, and the gate on/off voltages VON and VOFF.

The power line 600 may further include a control signal line 650*a* and a repair line 670*a*.

The control signal line 650*a* includes a vertical start signal line 651*a*, a gate selection signal line 653*a* and an output enable signal line 655*a*.

The vertical start signal line 651*a*, the gate selection signal line 653*a* and the output enable signal line 655*a* respectively receive a vertical start signal STV, a gate selection signal CPV and an output enable signal OE.

The vertical start signal STV is used when a first gate line of the gate lines GL is selected. For example, the first gate line may start to receive the gate-on voltage VON, synchronized with the vertical start signal STV.

The gate selection signal CPV sets each of the gate signals provided to each of the gate lines GL at a high level based on the gate-on voltage VON. For example, each of the gate lines GL may start to receive the gate-on voltage VON, synchronized with the gate selection signal CPV.

The output enable signal OE sets each of the gate signals provided to each of the gate lines GL at a low level based on the gate-off voltage VOFF. For example, each of the gate lines GL may start to receive the gate-off voltage VOFF, synchronized with the gate selection signal CPV.

A control signal bump 650*b* includes a vertical start signal bump 651*b*, a gate selection signal bump 653*b* and an output enable signal bump 655*b*. The vertical start signal bump 651*b*, the gate selection signal bump 653*b* and the output enable signal bump 655*b* are respectively formed at an end of the vertical start signal line 651*a*, an end of the gate selection signal line 653*a* and an end of the output enable signal line 655*a*.

The gate line driving chip 300 is attached to upper portions of the vertical start signal bump 651*b*, the gate selection signal bump 653*b* and the output enable signal bump 655*b*. The vertical start signal bump 651*b*, the gate selection signal bump 653*b* and the output enable signal bump 655*b* respectively receive the vertical start signal STV, the gate selection signal CPV and the externally received output enable signal OE. The vertical start signal STV, the gate selection signal CPV and the output enable signal OE are applied to the gate line driving chip 300.

The repair line 670*a* repairs the data line DL when the data line DL is defective. For example, the repair line 670*a* prevents a display area, from a defect point to the end of the data line DL, from stopping operation when the data line DL is defective. The repair line 670*a* may be tested by contacting the probe with a repair bump 670*b* formed at an end of the repair line 670*a*.

An insulation layer may be disposed between the repair line 670*a* and the data line DL that crosses over the repair line 670*a*, so that the repair line 670*a* is electrically connected to the data line DL by a laser.

Therefore, pixels from the defect point to the end of the data line DL may receive data signals through the repair line 670*a* when the data line DL is defective. Thus, the entire display area DA may receive normal data signals.

The first power bump 611*b*, the second power bump 613*b*, the on-voltage bump 631*b*, the off-voltage bump 633*b*, the vertical start signal bump 651*b*, the gate selection signal bump 653*b* and the output enable signal bump 655*b* of the power line 600 each make contact with the probe 4000 to receive the test signal TS and the test voltage TV. The probe 4000 may provide the gate test pad 210 and the power line 600 with the test signal TS and the test voltage TV at the same time.

Figure 4:
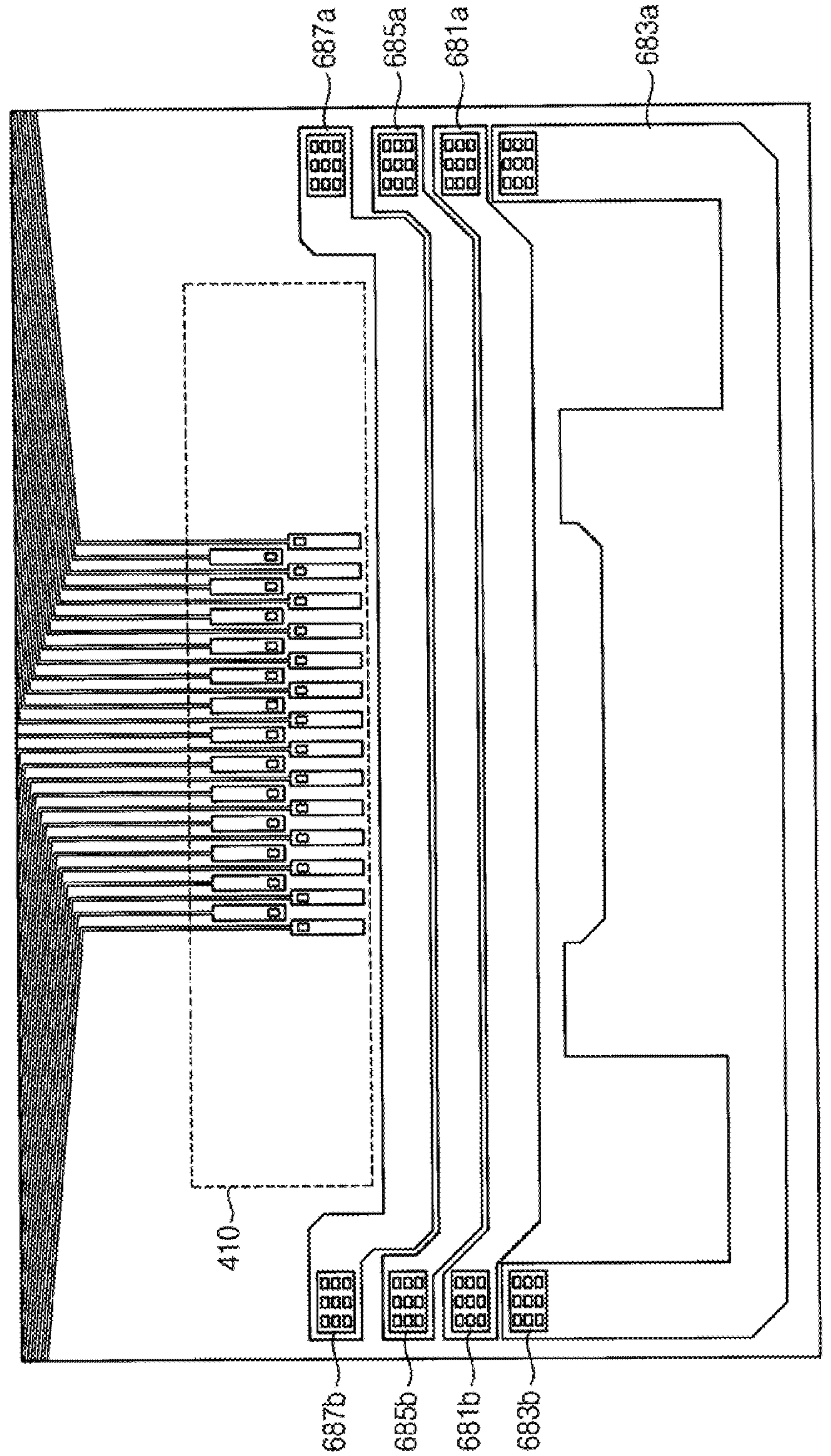
FIG. 4 is a plan view illustrating lines of the data line driver in FIG. 1.

FIG. 4 is a plan view illustrating lines of the data line driver in FIG. 1.

Referring FIGS. 1 to 4, the data line driver 400 includes a data test pad 410.

The defects of the display area DA of the display panel 1000 may be detected through the data test pad 410. The display panel 1000 operates when the gate line GL receives the test signal TS and the test voltage TV through the data test pad 410. In this case, the display panel 1000 may be defective when the displays area DA of the display panel 1000 does not operate uniformly. The data lest pad 410 may receive the test signal TS and the test voltage TV from the probe 4000 which is an external test apparatus.

In addition, the data line driving chip attached to the array substrate 1100 receives a data driving signal through a PCB (not shown). In this case, the data line driving chip is electrically connected to the PCB (not shown) through the driving voltage line 610*a* and the on/off voltage line 630*a*.

The power line 600 of the data line driver 400 includes a first constant voltage line 681*a*, a first ground voltage line 683*a*, a second constant voltage line 685*a* and a second ground voltage line 687*a*.

A first constant voltage VDD1 and a first ground voltage VSS1 provided to the first constant voltage line 681*a* and the first ground voltage line 683*a* ma, be digital voltage sources provided to logic circuits. In addition, a second constant voltage VDD2 and a second ground voltage VSS2 provided to the second constant voltage line 685*a* and the second ground voltage line 687*a* may be analog voltage sources such as gray voltages provided to the pixels.

A first constant voltage bump 681*b*, a first ground voltage bump 683*b*, a second constant voltage bump 685*b* and a second ground voltage bump 687*b* are respectively formed at ends of the first constant voltage line 681*a*, the first ground voltage line 683*a*, the second constant voltage line 685*a* and the second ground voltage line 687*a*.

The data line driving chip is attached to upper portions of the first constant voltage bump 681*b*, the first ground voltage bump 683*b*, the second constant voltage bump 685*b* and the second ground voltage bump 687*b*. The data line driving chip receives the first constant voltage VDD1, the first ground voltage VSS1 the second constant voltage VDD2 and the second ground voltage VSS2 through the first constant voltage bump 681*b*, the first ground voltage bump 683*b*, the second constant voltage bump 685*b* and the second ground voltage bump 687*b*.

Accordingly, the gate test pad 2109 the data test pad 410, the first power bump 611*b*, the second power bump 613*b*, the on-voltage bump 631*b*, the off-voltage bump 633*b*, the vertical start signal bump 651*b*, the gate selection signal bump 653*b*, the output enable signal bump 655*b*, the first constant voltage bump 681*b*, the first ground voltage bump 683*b*, the second constant voltage bump 685*b* and the second ground voltage bump 687*b* are probed by the probe 4000 at the same time, so that the defects of the display area DA and defects of power lines are detected at a cell test stage, which is a stage of the manufacturing process where each cell of the LCD panel is tested. The cell test stage occurs prior to the final assembly of the LCD panel and thus, by testing for defects in the display area DA and the power lines at this stage, remedial action may be performed prior to final assembly, and thus, potential problems can be addressed early on in the manufacturing process so that fewer completed LCD panels are rejected after a point at which significant costs have been incurred. Therefore, the defects of the display area DA and defects of power lines before the display apparatus is completely assembled, so that manufacturing costs may be decreased.

Figure 5:
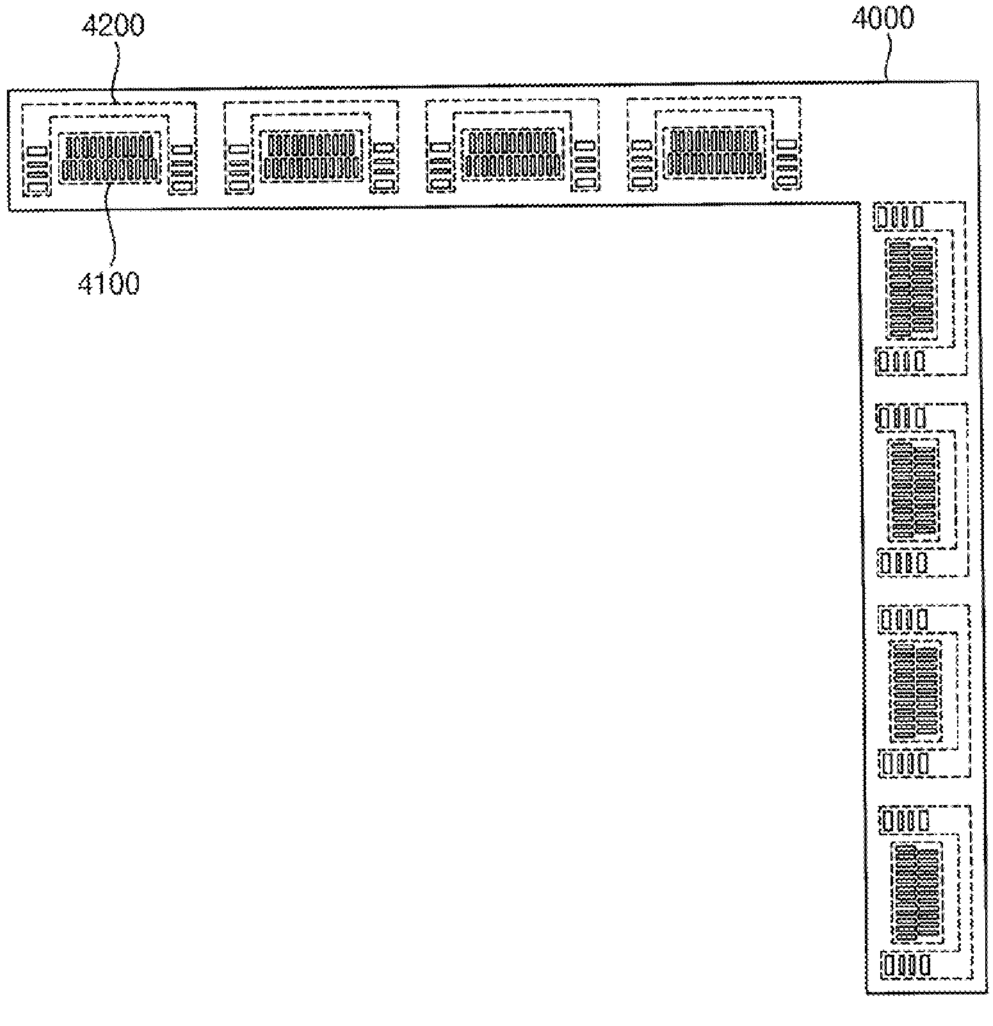
FIG. 5 is a plan view illustrating an example of the probe in FIG. 2 according to an exemplary embodiment of the present invention.

FIG. 5 is a plan view illustrating an example of the probe in FIG. 2 according to an exemplary embodiment of the present invention.

Referring to FIGS. 4 and 5, the probe 4000 includes a first contacting part 4100 and a second contacting part 4200. The defects of the power line 600 may be detected by using the first contacting part 4100 which makes contact with bumps formed on an end of the power line 600 in the gate line driver 200 and the data line driver 400. The defects of the display area DA may be detected by using the second contacting part 4200 which makes contact with the gate test pad 210 and the data lest pad 410.

The first contacting part 4100 and the second contacting part 4200 are integrally formed. Therefore, the defects of the power line 600 and the display area DA of the display panel 1000 may be detected at substantially the same time by using the probe 4000. Thus, the cell test stage may be simplified so that manufacturing costs may be decreased.

Figure 6:
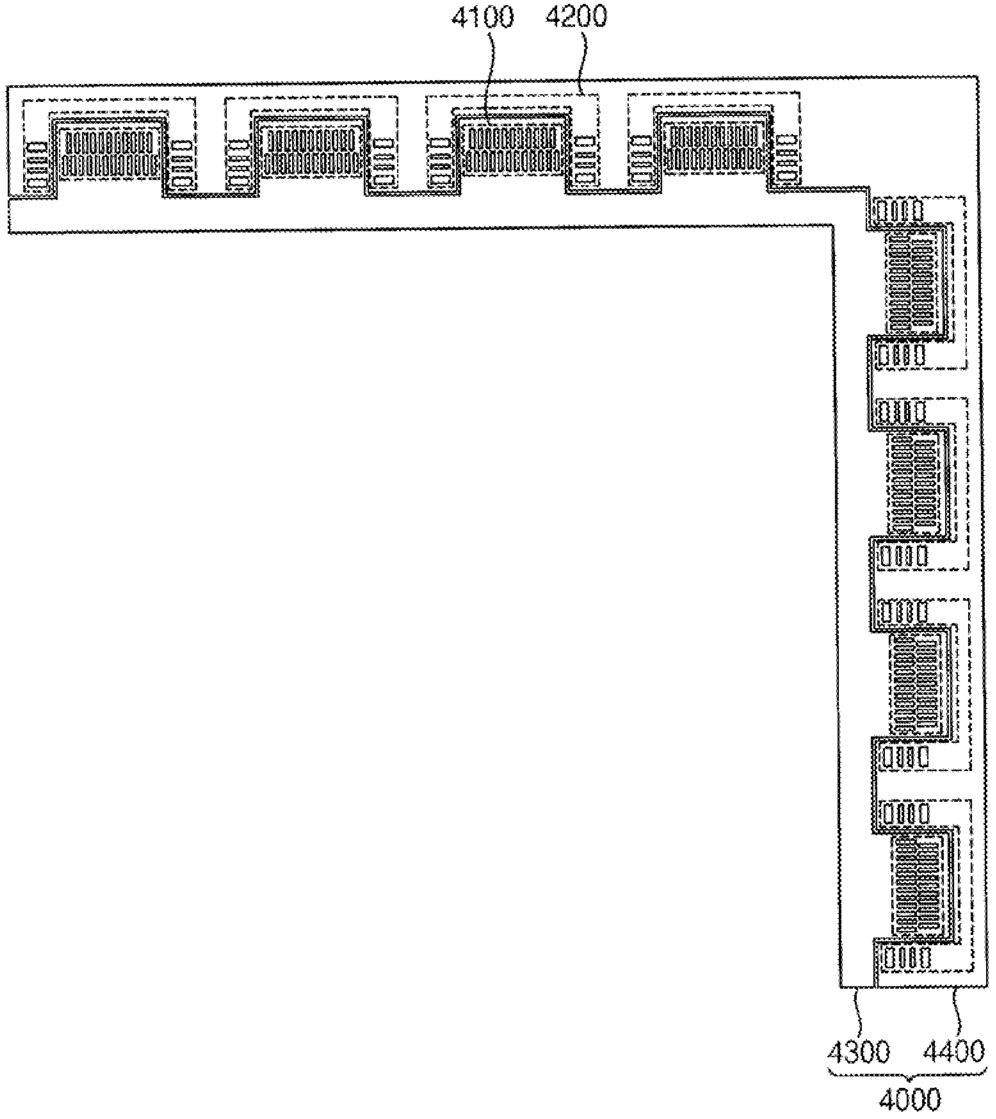
FIG. 6 is a plan view illustrating an example of the probe in FIG. 2 according to an exemplary embodiment of the present invention.

FIG. 6 is a plan view illustrating an example of the probe in FIG. 2 according to an exemplary embodiment of the present invention.

Referring to FIGS. 4 and 6, the probe 4000 includes a first contacting part 4100 and a second contacting part 4200. The defects of the power line 600 may be detected by using the first contacting part 4100 which makes contact with bumps formed on the end of the power line 600 of the gate line driver 200 and the data line driver 400. The defects of the display area DA may be detected by using the second contacting part 4200 which makes contact with the gate test pad 210 and the data test pad 410.

The first contacting part 4100 and the second contacting part 4200 may be respectively formed on a pad testing probe 4300 and a line testing probe 4400 which may be used separately. Therefore, the power line 600 and the display area DA of the display panel 1000 may be separately tested by using the pad testing probe 4300 and the line testing probe 4400.

The defects of the power line 600 and the display area DA of the display panel 1000 may thus be detected at the cell test stage. Additionally, the first contacting part 4100 and the second contacting part 4200 may make contact with the bumps of the power line 600 and the gate and data pads 210 and 410 to obtain accurate test results.

Figure 7:
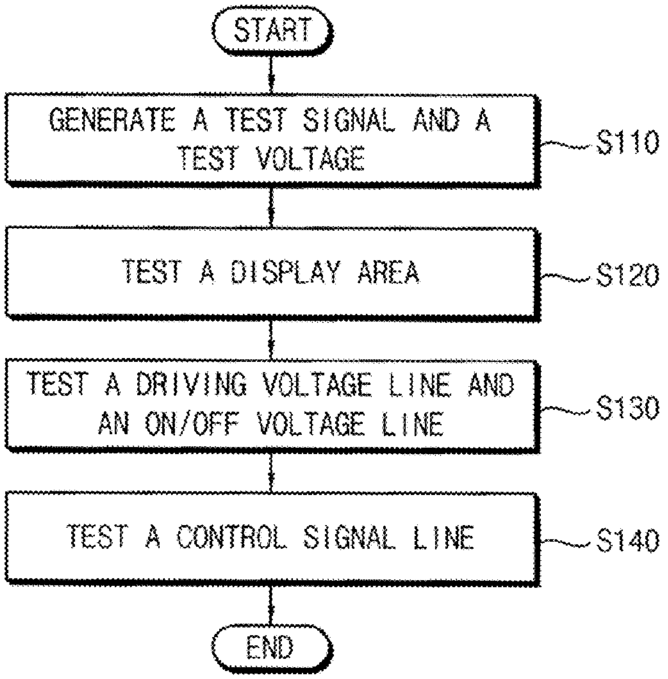
FIG. 7 is a flowchart illustrating a method of testing the displays panel in FIG. 1.

FIG. 7 is a flowchart illustrating a method of testing the display panel in FIG. 1.

Referring to FIGS. 1, 2 and 7, the test apparatus 2000 generates the test signal TS and the test voltage TV according to the test control signal CONT (step S110).

The test apparatus 2000 tests the display area DA of the display panel 1000 including the driving voltage line 610*a* and the on/off voltage line 630*a*, based on the test signal TS and the test voltage TV (step S120).

The test apparatus 2000 tests the driving voltage line 610*a* and the on/off voltage line 630*a* by using the driving voltage bump 610*b* and the on/off voltage bump 630*b* which are electrically connected to the driving voltage line 610*a* and the on/off voltage line 630*a*, respectively (step S130).

The test apparatus 2000 tests the control signal line 650*a* by using the control signal bump 650*b* which is electrically connected to the control signal line 650*a* (step S140).

Step S120, step S130 and step S140 may be performed at the same time using the probe 4000 described in FIG. 5.

Alternatively, step S130 and step S140 may be performed using the line testing probe 4400 of the probe 4000 after step S120 is performed using the pad testing probe 4300 of the probe 4000 in FIG. 6.

Accordingly, the defects of the power line 600 and the defects of the display area DA of the display, panel 1000 may be detected at the cell test stage, which is an initial stage of a manufacturing process, at substantially the same time. Therefore, manufacturing costs of the display apparatus may be decreased.

As described above, according to the present invention, defects of a power line, as well as a display area, may be detected at a cell test stage which is an initial stage of a manufacturing process ea. Therefore, manufacturing costs of a display apparatus may be reduced.

The method for testing a display panel discussed above may be performed with the assistance of a computer system which may implement a method and system of the present disclosure. The system and method of the present disclosure may, be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The foregoing is illustrative of the present invention and is not to be construed as limiting thereof. Although several exemplary embodiments of the present invention have been described herein, those skilled in the art will readily appreciate that many modifications are possible in the exemplary embodiments without materially departing from the present invention.

What is claimed is:

1. A method of testing a display panel, the method comprising:

connecting a probe, which is an external test apparatus and comprises a first contacting part and a second contacting part, to the display panel;

generating a test signal and a test voltage according to a test control signal;

testing a display area of the display panel based on the test signal and the test voltage by applying the test signal and the test voltage from the second contacting part of the probe to test pads of the display panel, respectively; and testing a driving voltage line and an on/off voltage line formed on the display panel, based on the test signal and the test voltage by applying the test signal and the test voltage from the first contacting part of the probe to bumps formed on the display panel.

2. The method of claim 1, wherein the pads of the display panel include a gate test pad and a data test pad respectively connected to ends of a gate line and a data line of the display panel, and wherein the display area is tested by:

providing the gate test pad and the data test pad with the test signal and the test voltage, respectively, each through the probe.

3. The method of claim 2, wherein the bumps formed on the display panel include a driving voltage bump formed at an end of the driving voltage line and an on/off bump formed at an end of the on/off voltage line, and wherein the driving voltage line and the on/off voltage line are tested by:

providing the driving voltage bump and the on/off voltage bump with the test signal and the test voltage, respectively, each through the probe.

4. The method of claim 1, wherein the pads of the display panel include a gate test pad and a data test pad respectively connected to ends of a gate line and a data line of the display panel, wherein the second contacting part of the probe is a pad testing probe, and wherein the display area is tested by:

providing the gate test pad and the data test pad with the test signal and the test voltage, respectively each through the pad testing probe.

5. The method of claim 4, wherein the bumps formed on the display panel include a driving voltage bump formed at an end of the driving voltage line and an on/off bump formed at an end of the on/off voltage line, wherein the first contacting part of the probe is a line testing probe, and wherein the driving voltage line and the on/off voltage line are tested by:

providing the driving voltage bump and the on/off voltage bump with the test signal and the test voltage, respectively, each through the line testing probe.

6. The method of claim 1, wherein testing the driving voltage line and the on/off voltage line comprises testing a control signal line.

7. The method of claim 6, wherein a vertical start signal, a gate selection signal and an output enable signal are transmitted through the control signal line, the vertical start signal selects a first gate line of the display panel, the gate selection signal sets a gate signal provided to the gate line at a high level based on a gate-on voltage, and the output enable signal sets the gate signal at a low level based on the gate-off voltage.

8. The method of claim 1, wherein the display area and the driving voltage and the on/off voltage lines are tested at substantially the same time.

9. A computer system comprising:

a processor; and a program storage device readable by the computer system, embodying a program of instructions executable by the processor to perform method steps for testing a display panel, the method comprising:

connecting a probe, which is an external test apparatus and comprises a first contacting part and a second contacting part, to the display panel;

generating a test signal and a test voltage according to a test control signal;

testing a display area of the display panel based on the test signal and the test voltage by applying the test signal and the test voltage from the second contacting part of the probe to test pads of the display panel, respectively; and testing a driving voltage line and an on/off voltage line formed on the display panel, based on the test signal and the test voltage by applying the test signal and the test voltage from the first contacting part of the probe to bumps formed on the display panel.

10. The computer system of claim 9, wherein the pads of the display panel include a gate test pad and a data test pad respectively connected to ends of a gate line and a data line of the display panel, and wherein the display area is tested by:

providing the gate test pad and the data test pad with the test signal and the test voltages respectively, each through the probe.

11. The computer system of claim 10, wherein the bumps formed on the display panel include a driving voltage bump formed at an end of the driving voltage line and an on/off bump formed at an end of the on/off voltage line, and wherein the driving voltage line and the on/off voltage line are tested by:

providing the driving voltage bump and the on/off voltage bump with the test signal and the test voltage, respectively, each through the probe.

12. The computer system of claim 9, wherein testing the driving voltage line and the on/off voltage line comprises testing a control signal line and wherein a vertical start signal, a gate selection signal and an output enable signal are transmitted through the control signal line, the vertical start signal selects a first gate line of the display panel, the gate selection signal sets a gate signal provided to the gate line at a high level based on a gate-on voltage, and the output enable signal sets the gate signal at a low level based on the gate-off voltage.

* * * * *

UNITED STATES PATENT AND TRADEMARK OFFICE

CERTIFICATE OF CORRECTION

PATENT NO. : 8,415,965 B2
APPLICATION NO. : 12/496386
DATED : April 9, 2013
INVENTOR(S) : Dae-Hye Cho et al.

It is certified that error appears in the above-identified patent and that said Letters Patent is hereby corrected as shown below:

Title Page, Item (30)

THE FOREIGN PRIORITY INFORMATION IN LETTERS PATENT please insert,

-- KR 10-2009-0008259 - filed - FEBRUARY 3, 2009 --

Signed and Sealed this
Twenty-fifth Day of June, 2013

Teresa Stanek Rea
*Acting Director of the United States Patent and Trademark Office*